(12) United States Patent
Lee et al.

(10) Patent No.: US 6,438,047 B1
(45) Date of Patent: Aug. 20, 2002

(54) SEMICONDUCTOR MEMORY DEVICE AND METHOD OF REPAIRING SAME

(75) Inventors: Yun-Sang Lee, Yongin; Jong-Hyun Choi, Suwon; Sang-Suk Kang, Suwon; Kyu-Nam Lim, Suwon, all of (KR)

(73) Assignee: Samsung Electronics Co., Ltd., Kyungki-Do (KR)

( * ) Notice: Subject to any disclaimer, the term of this patent is extended or adjusted under 35 U.S.C. 154(b) by 0 days.

(21) Appl. No.: 09/908,192

(22) Filed: Jul. 18, 2001

(30) Foreign Application Priority Data

Sep. 28, 2000 (KR) .............................. 00-57067

(51) Int. Cl.[7] ................................. G11C 7/00
(52) U.S. Cl. ...................... 365/200; 365/191
(58) Field of Search ................ 365/200, 189.04, 365/191

(56) References Cited

U.S. PATENT DOCUMENTS 5,696,724 A  * 12/1997 Koh et al. .................. 365/205
6,292,413 B1 *  9/2001 Kato et al. .................. 365/200

FOREIGN PATENT DOCUMENTS

JP         404134787   *   5/1992 ......... G11C/11/401

OTHER PUBLICATIONS

Betty Prince, "Semiconductor Memories", 1983, Wiley, 2$^{nd}$ pp. 169–170.*

* cited by examiner

*Primary Examiner*—M. Tran
(74) *Attorney, Agent, or Firm*—F.Chau & Associates, LLP (57) ABSTRACT

A semiconductor memory device comprises a memory cell array, at least one redundant cell control, a sense amplifier, and at least one redundant cell. The memory cell array receives and outputs data through data I/O line groups. The redundant cell control stores a defective cell address, generates a redundant cell enable control signal when the defective cell address is equal to an input cell address, generates a redundant cell read control signal during a read operation in response to the redundant cell enable control signal, and generates a redundant cell write control signal during a write operation in response to the redundant cell enable control signal. The sense amplifier is connected to an I/O line group commonly connected to the data I/O line groups, amplifies and outputs data outputted from the memory cell array during the read operation, and is disabled in response to the redundant cell read control signal. The redundant cell stores input data transferred to the I/O line group in response to the redundant cell write control signal and outputs stored data in response to the redundant cell read control signal.

33 Claims, 8 Drawing Sheets

SEMICONDUCTOR MEMORY DEVICE AND METHOD OF REPAIRING SAME

CROSS REFERENCE

This application claims the benefit of Korean Patent Application No. 2000-57067, filed on Sep. 28, 2000, the disclosures of which are incorporated by reference herein in their entirety.

BACKGROUND OF THE INVENTION

1. Field of the Invention

The invention relates to a semiconductor memory device and a method of repairing the same.

2. Description of Related Art

In general, a memory cell array of a semiconductor memory device comprises a normal memory cell array and a redundant memory cell array. When defective normal cells are detected at wafer level during production, the defective normal memory cells may be deactivated and the redundant memory cells brought online, thereby reducing the number of rejects in the manufacturing process. However, even though the semiconductor memory device is thus repaired by being replaced with the redundant memory cells at wafer level, when the semiconductor memory device is tested at a package level, defective memory cells may still be found.

More than about 80% of memory defects at the packaging level are attributable to failure of 1-bit or 2-bit memory cells. Thus, if a defective 1-bit or 2-bit memory cell can be repaired, the yield of semiconductor memory devices can be significantly improved.

Typically, in order to repair a semiconductor memory device at a package level, redundant cells are arranged between adjacent data I/O line pairs that configure data I/O line groups located between memory cell array blocks, so that the redundant cells may be brought online. However, as a capacity of the memory cell array increases, an intervals between the memory cell array blocks becomes narrower and it becomes increasingly difficult to arrange redundant cells between data I/O line pairs.

SUMMARY OF THE INVENTION

Preferred embodiments of the invention provide a semiconductor memory device, comprising a memory cell array receiving and outputting data through data I/O line groups; at least one redundant cell control for storing a defective cell address, generating a redundant cell enable control signal when the defective cell address is equal to an input cell address, generating a redundant cell read control signal during a read operation in response to the redundant cell enable control signal, and generating a redundant cell write control signal during a write operation in response to the redundant cell enable control signal; a sense amplifier connected to an I/O line group commonly connected to the data I/O line groups, amplifying and outputting data outputted from the memory cell array during the read operation, and disabled in response to the redundant cell read control signal; and at least one redundant cell means storing input data transferred to the I/O line group in response to the redundant cell write control signal and outputting stored data in response to the redundant cell read control signal.

Preferably, the sense amplifier comprises a current amplifier to detect and amplify a current difference of respective I/O line pairs of the I/O line group and a driver to drive the output signals of the current amplifying means.

A preferred embodiment of the invention further provides a semiconductor memory device, comprising a memory cell array receiving and outputting data through data I/O line groups; at least one redundant cell control storing a defective cell address, generating a redundant cell enable control signal when the defective cell address is equal to an input cell address, generating a redundant cell read control signal during a read operation in response to the redundant cell enable control signal, and generating a redundant cell write control signal during a write operation in response to the redundant cell enable control signal; a sense amplifier amplifying data transferred through the data I/O line groups and transferring the data to an I/O line group commonly connected to the data I/O line groups during the read operation, and disabled in response to the redundant cell read control signal; and at least one redundant cell storing input data transferred to the I/O line group in response to the redundant cell write control signal and outputting stored data in response to the redundant cell read control signal.

The sense amplifier detecting and amplifying a voltage difference of data transferred through the data I/O line groups.

Another preferred embodiment of the invention provides a method of repairing a semiconductor memory device comprising a memory. cell array for receiving and outputting data through data I/O line groups and an I/O line group commonly connected to the data I/O line groups. The method comprises storing a defective cell address in response to all control signals; generating a redundant cell enable control signal when an input address is equal to the defective cell address; generating a redundant cell read control signal during a read operation and generating a redundant cell write control signal during a write operation in response to the redundant cell enable control signal; and outputting data stored in a redundant cell in response to the redundant cell read control signal during the read operation, and storing input data from the redundant cell in response to the redundant cell write control signal during the write operation.

DETAILED DESCRIPTION OF PREFERRED EMBODIMENTS

Figure 1:
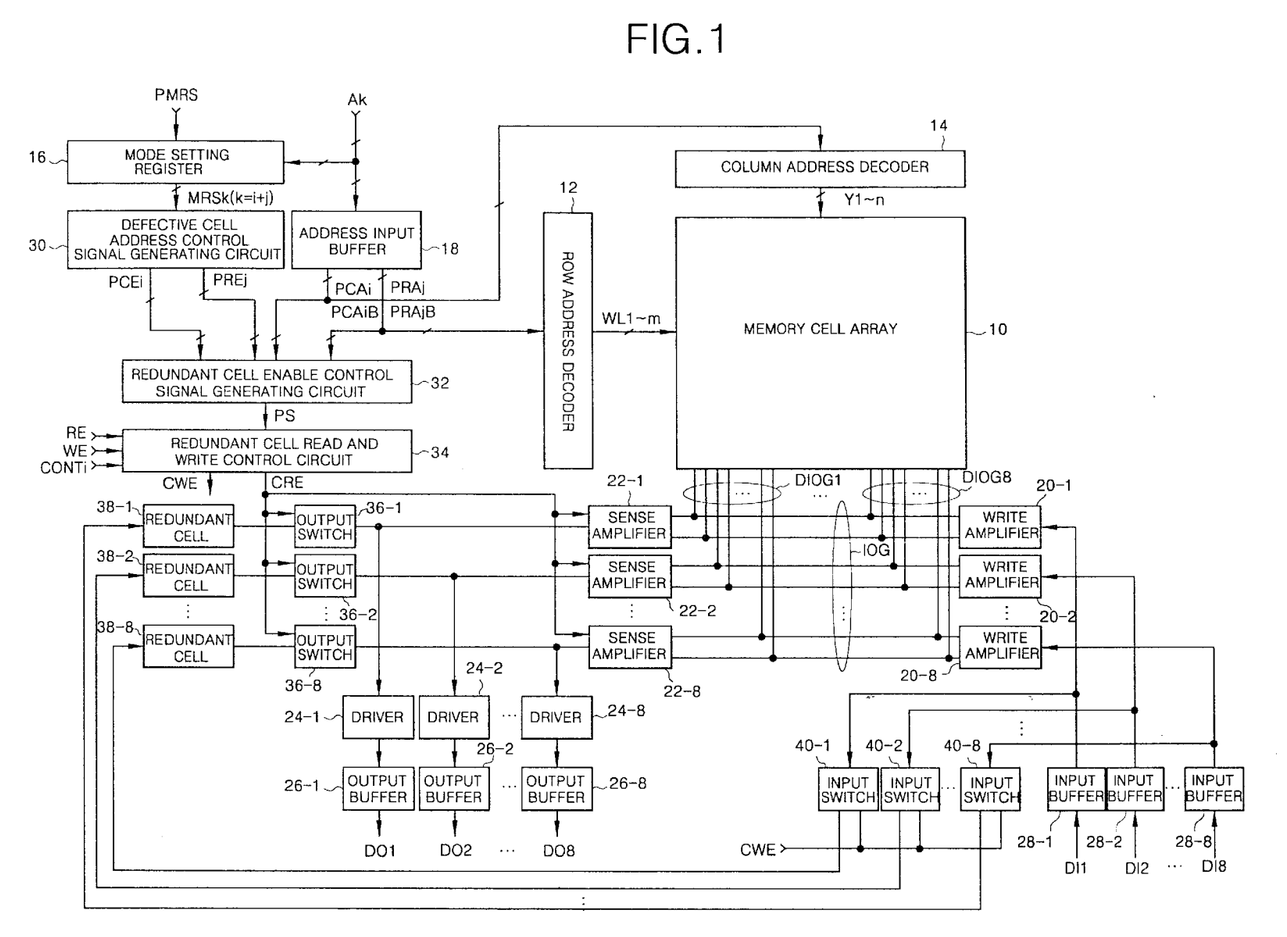
FIG. 1 is a block diagram illustrating an embodiment of a semiconductor memory device of the invention.

Referring to FIG. 1, a semiconductor memory device according to an embodiment of the invention comprises a memory cell array 10, a row address decoder 12, a column address decoder 14, a mode setting register 16, an address input buffer 18, write amplifiers 20-1 to 20-8, sense amplifiers 22-1 to 22-8, drivers 24-1 to 24-8, output buffers 26-1 to 26-8, input buffers 28-1 to 28-8, a defective cell address control signal generating circuit 30, a redundant cell enable control signal generating circuit 32, a redundant cell read and write control circuit 34, output switches 36-1 to 36-8 and input switches 40-1 to 40-8, and redundant cells 38-1 to 38-8. The configuration shown is illustrated for eight-bit data, but it is to be understood that the invention is easily generalizable to any n-bits of data. Note that the figure is substantially similar to a conventional memory device except for the addition of the defective cell address control signal generating circuit 30, the redundant cell enable control signal generating circuit 32, the redundant read and write control circuit 34, output: switches 36-1 to 36-8, input switches 40-1 to 40-8, redundant cells 38-1 to 38-8, and supporting circuitry.

Also provided will be data input signals DI1 to DI8 and data output signals DO1 to DO8, which usually will be inputted or outputted through same data I/O pins. Data I/O line groups DIOG1 to DIOG8 and an I/O line group IOG communicate data to and from the memory cell array 10.

The memory cell array 10 receives data from one group among I/O line groups DIOG1 to DIOG8 or outputs data to one group among the data I/O line groups DIOG1 to DIOG8, in response to one of m number of word line selecting signals WL1-m or one of n number of column selecting signals Y1-n. The row address decoder 12 decodes buffered row address signals PRAj to generate m number of the word line selecting signals WL1-m. The column address decoder 14 decodes buffered column address PCAi to generate n number of the column selecting signals Y1-n. The mode setting register 16 stores defective addresses applied from address input pins (not shown) in response to control signal PMRS to generate defective address signals MRSk(k=i+j). The address input buffer 18 receives and buffers an address Ak to generate buffered row address PCAi and PCAiB and buffered column address PRAj and PRAjB. The write amplifiers 20-1 to 20-8 amplify data outputted from the input buffers 28-1 to 28-8 and output amplified data to the I/O line group IOG. The input buffers 28-1 to 28-8 buffer and then output the input data DI1 to DI8. The sense amplifiers 22-1 to 22-8 amplify and then output the difference of respective I/O line pairs of the I/O line group IOG and are enabled or disabled in response to a redundant cell read control signal CRE. The drivers 24-1 to 24-8 drive data outputted from the sense amplifiers 22-1 to 22-8, or data outputted from the output switches 36-1 to 36-8. The output buffers 26-1 to 26-8 buffer and then output data outputted from the drivers 24-1 to 24-8.

The output switches 36-1 to 36-8 output data stored in the redundant cells 38-1 to 38-8 in response to the redundant cell read control signal CRE. When the output switches 36-1 to 36-8 are activated by the cell read control signal CRE, the sense amplifiers 22-1 to 22-8 are disabled. The input switches 40-1 to 40-8 transfer data outputted from the input buffers 28-1 to 28-8 to the redundant cells 38-1 to 38-8. The redundant cells 38-1 to 38-8 store data transferred from the input switches 40-1 to 40-8.

The defective cell address control signal generating circuit 30 stores the defective address signals MRSk(k=i+j) to generate the defective cell address control signals PCEi and PREj. The redundant cell enable control signal generating circuit 32 generates a redundant cell enable control signal PS in response to the defective cell address control signals PCEi and PREj when a buffered address is a defective address. The redundant cell read and write control circuit 34 generates the redundant cell enable control signal PS as the redundant cell read control signal CRE in response to a control signal CONTi and a read command RE. The redundant cell enable control signal PS is generated as the redundant cell write control signal CWE in response to a control signal CONTi and a write command WE.

In a preferred embodiment of the invention, the redundant cells 38-1 to 38-8 are arranged between the sense amplifiers 22-1 to 22-8 and the drivers 24-1 to 24-8.

Figure 2:
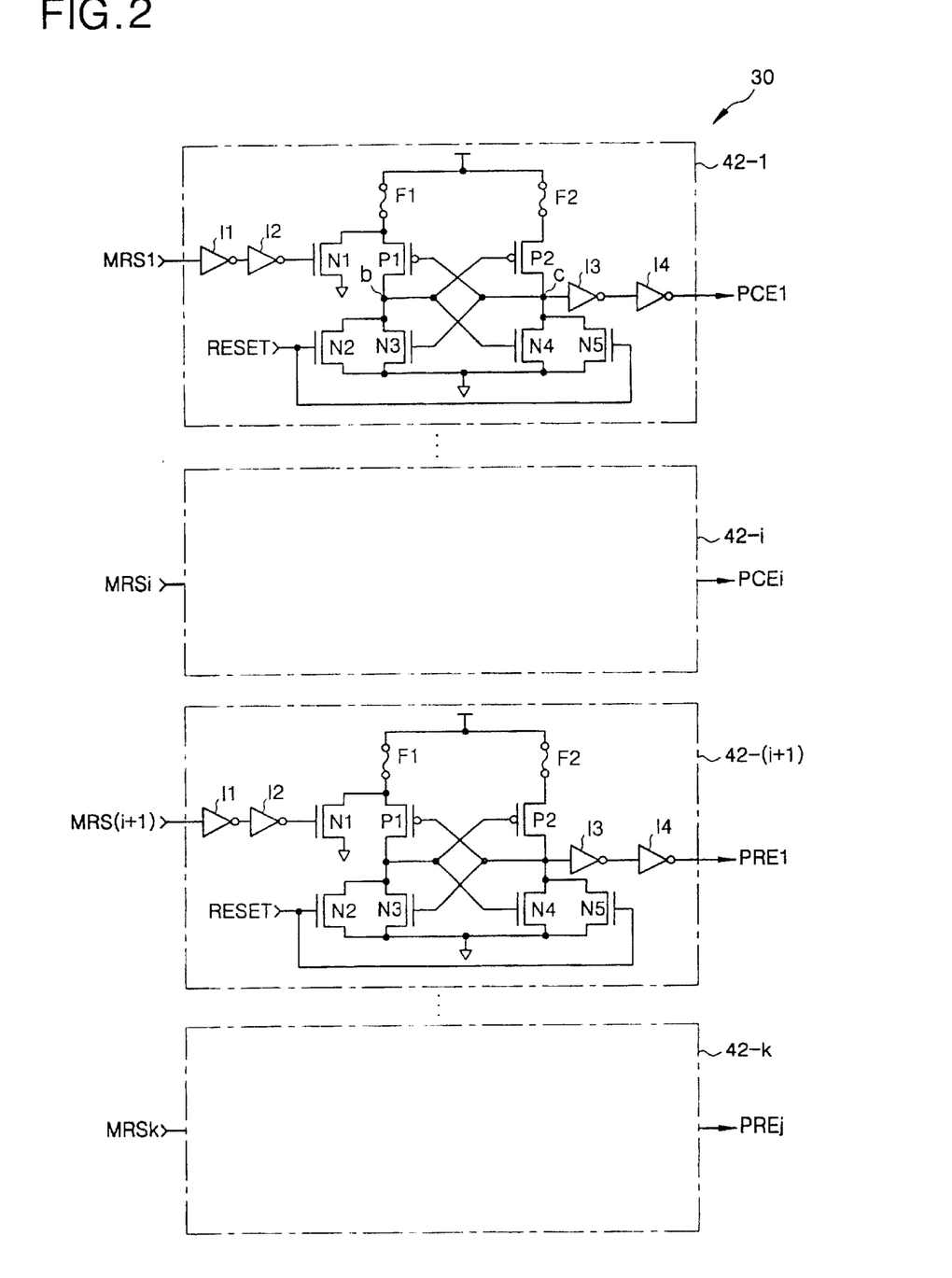
FIG. 2 is a circuit diagram illustrating an embodiment of a defective cell address control signal generating circuit.

FIG. 2 is a circuit diagram illustrating a configuration of the defective cell address control signal generating circuit 30 of FIG. 1, which comprises a plurality of defective cell address control signal generating sub-circuits 42-1 to 42-k. In a preferred embodiment, each defective address control signal generating sub-circuit comprises inverters I1 to I4, fuses F1 and F2, NMOS transistors N1 to N5, and PMOS transistors P1 and P2. The fuse F1 is designed to be smaller in resistance value than the fuse F2.

An operation of the defective cell address control signal generating sub-circuit 42-1 is as follows: when a signal MRS1 having a logic "low" is applied, the fuse F1 is not cut. In this state, when the reset signal RESET having a logic "high" is applied, the NMOS transistors N2 and N5 are turned on, such that the voltage at node "b" becomes slightly higher than the voltage at node "c". In this state, when the reset signal RESET is transited from logic "high" level to a logic "low" level, the NMOS transistors N2 and N5 are turned off, and the NMOS transistor N4 is activated more strongly than NMOS transistor N3 so that the voltage level at node "b" is raised while that at node "c" is lowered. The inverters I3 and I4 buffer and delay the signal at node "c" so as to generate the defective cell address control signal PCE1 having a logic "low" level. The logic "low" at node "c" is latched and held by PMOS transistors P1, P2 and NMOS transistors N3, N4.

When a signal MRS1 having a logic "high" level is applied, the fuse F1 is cut, causing blown fuse F1 to now be of greater resistance than that of F2. In this state, when the reset signal RESET having a logic "high" is applied, the NMOS transistors N2 and N5 are turned on. Therefore the voltage at node "b" drops slightly below that of node "c". When the reset signal RESET goes from logic "high" to logic "low", NMOS transistors N2 and N5 shut off and NMOS transistor N3 is activated more strongly than N4. This causes the voltage at node "c" to rise and the voltage at node "b" to drop. The inverters I3 and I4 buffer and delay a signal at node "c" and generate the defective address control signal PCE1 as a logic "high" level The logic "high" at node "c" is latched and held by the PMOS transistors P1, P2 and the NMOS transistors N3, N4.

As described above, it is possible to hold a level of the defective cell address control signal PCE1.

An operation of the other defective cell address control signal generating circuits 42-2 to 42-k is identical to that of the defective cell address control signal generating circuit 42-1. In respective defective cell address control signal generating circuits 42-1 to 42-k, when the signals MRSk(k= i+j) have a logic "high". level, respective defective cell address control signals PCEi and PREJ having a logic "high" level are generated. When the signals MRSk(k=i+j) are "low", defective cell address control signals PCEi and PREj are "low", respectively.

Figure 3:
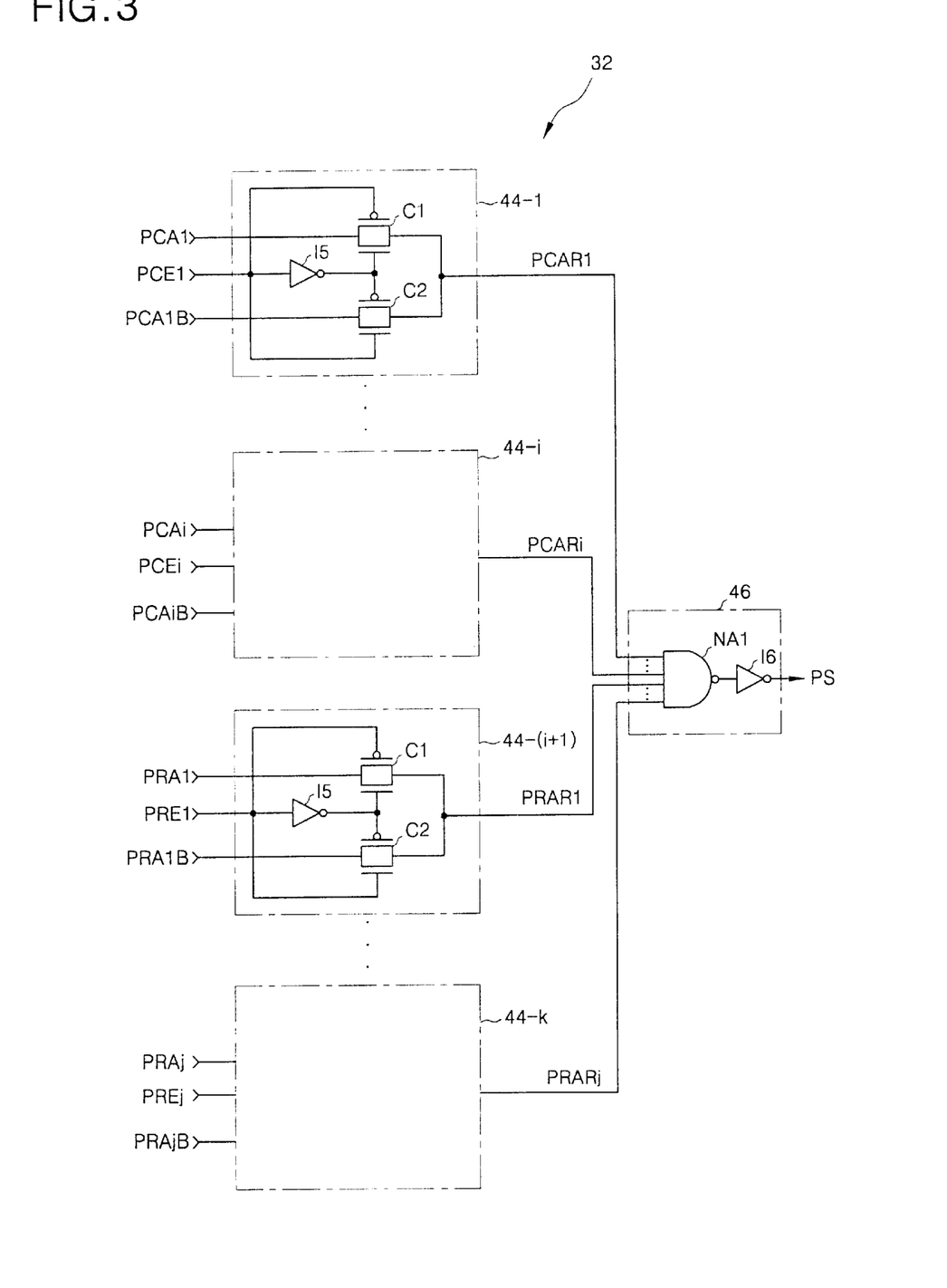
FIG. 3 is a circuit diagram illustrating an embodiment of a redundant cell enable control signal generating circuit.

FIG. 3 is a circuit diagram illustrating an embodiment of the redundant cell enable control signal generating circuit 32 of FIG. 1. The redundant cell enable control signal generating circuit comprises a plurality of signal generating sub-circuits 44-1 to 44-k and an AND gate 46. Each of the signal generating sub-circuits 44-1 to 44-k comprises an inverter 15 and CMOS transmission gates C1 and C2. The AND gate 46 will preferably comprise a NAND gate NA1 and an inverter 16.

An operation of a signal generating sub-circuit 44-1 is as follows: the CMOS transmission gate C2 is turned on in response to the defective cell address control signal PCE1 having a logic "high" level and thereby generates buffered inversion column address PCA1B as a signal PCAR1. The CMOS transmission gate C1 is turned on in response to the defective cell address control signal PCE1 having a logic "low" level so as to generate buffered column address PCA1 as the signal PCAR1.

The operation of the other signal generating sub-circuits 44-2 to 44-k is identical to that of the signal generating sub-circuit 44-1.

The AND gate 46 will generate a logical "high" redundant cell enable control signal PS by ANDing the signals PCAR1 to PCARi and PRAR1 to PRARj only when all of the signals PCAR1 to PCARi and PRAR1 to PRARj have a logic "high" level.

Consider as an example, if it is determined that an address of a defective cell has only zeroes (i.e., the very first logical address "00 . . . 0") by testing the device at a package level, then a k-bit address Ak having all ones ("11 . . . 1") is applied to and stored in the mode setting register 16 in response to a mode setting control signal PMRS at the package level. The defective cell address control signal generating circuit 30 stores a k-bit address MRSk of the defective cells having all "1" outputted from the mode setting register 16.

During a normal operation, when a k-bit address Ak having all zeroes is applied to the address input buffer 18, a k-bit buffered address (where k=i+j) may be formed by combining an i-bit buffered column address PCAi having a logic "low" level with a j-bit buffered row address PRAj having a logic "low" level, and a k-bit buffered inversion address may be formed by combining an i-bit buffered inversion column address PCAiB having a logic "high" level with a j-bit buffered inversion row address PRAjB having a logic "high" level.

As a result, the redundant cell enable control signal generating circuit 32 generates a k-bit buffered inversion address having a logic "high" level as signals PCAR1 to PCARi and PRAR1 to PRARj in response to the k-bit defective cell address control signals PCEi and PREj having all ones. The AND gate 46 generates the signal PS having a logic "high" level by ANDing the signals PCAR1 to PCARi and PRAR1 to PRARj. That is to say, when the signal PS has a logic "high" level, an operation to replace a defective cell with a redundant cell is carried out.

Figure 4:
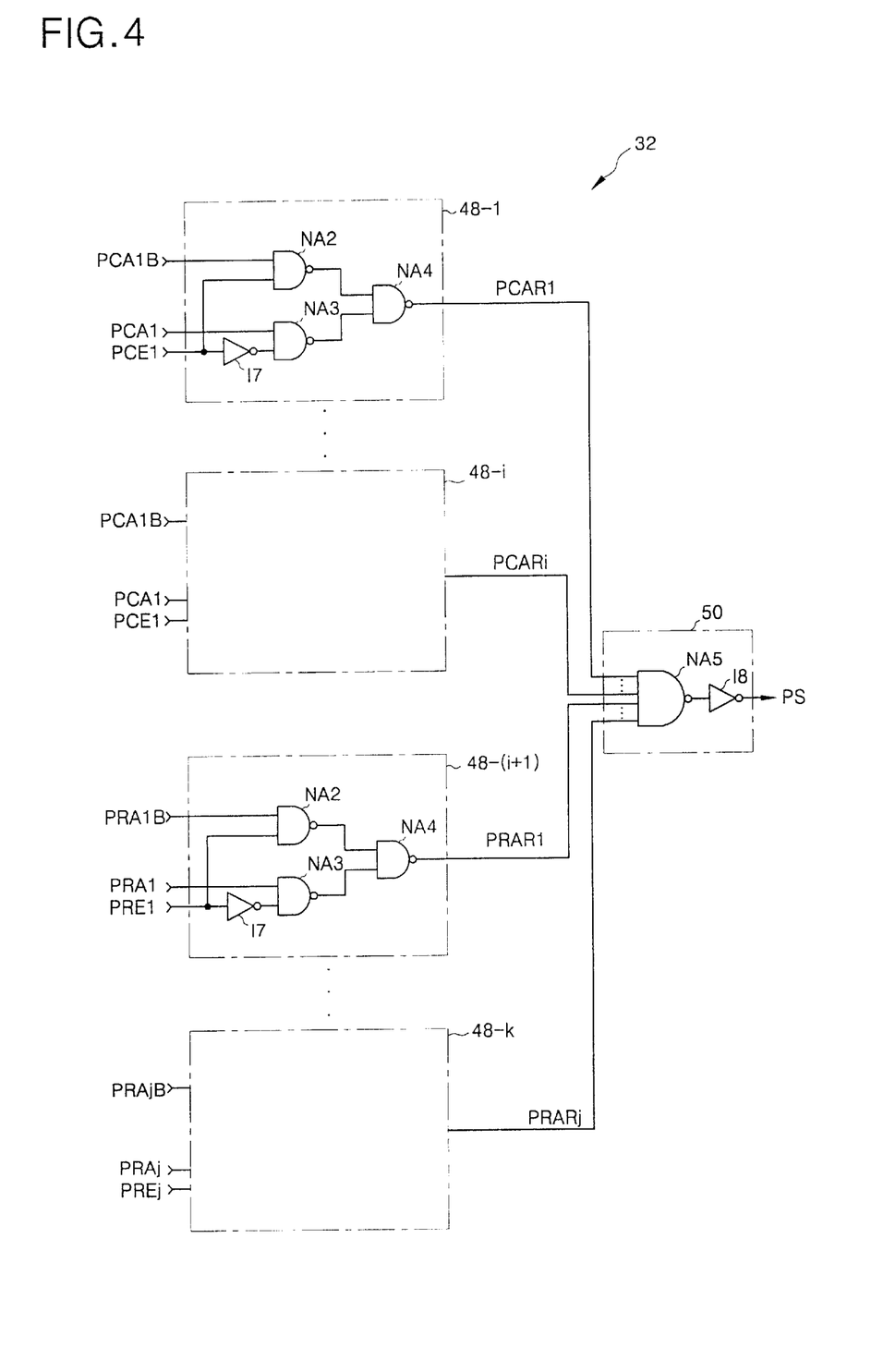
FIG. 4 is a circuit diagram illustrating another embodiment of a redundant cell enable control signal generating circuit.

FIG. 4 shows another embodiment of the redundant cell enable control signal generating circuit 32 of FIG. 1. The redundant cell enable control signal generating circuit comprises a plurality of signal generating sub-circuits 48-1 to 48-k and a AND gate 50. Each of the signal generating sub-circuits 48-1 to 48-k comprises NAND gates NA2, NA3 and NA4 and an inverter 17. The AND gate 50 preferably comprises a NAND gate NA5 and an inverter 18.

An operation of the signal generating sub-circuit 48-1 is as follows: when a signal PCE1 is a logic "high" level, the circuit 48-1 inverts and outputs a buffered inversion column address CA1B. When PCE1 is "low", the circuit 48-1 inverts and outputs a buffered column address CA1. The NAND gate NA4 generates the defective cell address control signal PCE1 having a logic "low" level when the output signals of the NAND gates NA2 and NA3 are all "high". The NAND gate NA4 generates the defective cell address control signal PCE1 having a logic "high" level when at least one among the output signals of the NAND gates NA2 and NA3 is a logic "low" level.

The operation of the other signal generating circuits 48-2 to 48-k is identical to that of the signal generating circuit 48-1.

The AND gate 50 generates a signal PS having a logic "high" level by ANDing the signals PCAR1 to PCARi and PRAR1 to PRARj only when the signals PCAR1 to PCARi and PRAR1 to PRARj are all "high".

As can be seen, the redundant cell enable control signal generating circuits 32 of FIGS. 3 and 4 perform the same function, which demonstrates that any number of circuit schemes may be improvised to perform the identical function.

Figure 5:
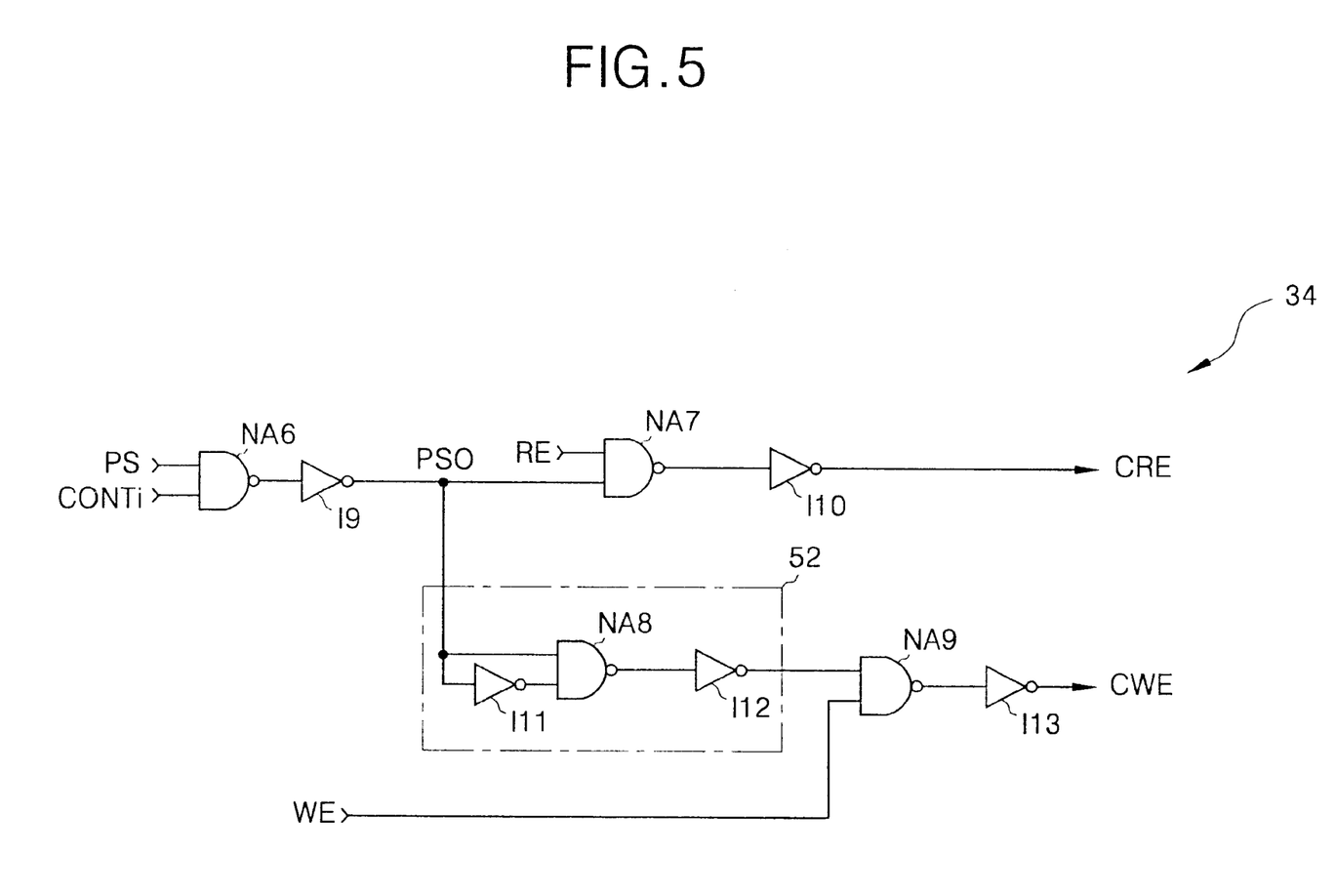
FIG. 5 is a circuit diagram illustrating an embodiment of a redundant cell control circuit.

FIG. 5 is a circuit diagram illustrating an embodiment of the redundant cell read and write control circuit 34 of FIG. 1. The redundant cell read and write control circuit 34 comprises NAND gates NA6, NA7 and NA9, inverters I9, I10 and I13, and a pulse generator 52 having a NAND gate NA8 and inverters I11 and I12.

An operation of the redundant cell read and write control circuit 34 of FIG. 5 is as follows: the circuit is activated when both redundant cell enable control signal PS and control commands CONTi are "high", which causes NAND gate NA6 and inverter I9 to generate a signal PSO having a logic "high" level. If now the read command RE goes "high", the NAND gate NA7 and the inverter I10 generate a redundant cell read control signal CRE having a logic "high" level.

The pulse generator 52 comprising the NAND gate NA8 and the inverters I11 and I12 generates a "high" pulse output that lapses after a brief time, dependant upon the speed of the inverter I11. The pulse is generated whenever the signal PSO goes from "low" to "high". If the write command WE is high during a pulse, then a "high" redundant cell write control signal CWE will be generated for the duration of the pulse. The pulse will therefore be timed to be of sufficient duration to ensure that data is written to the redundant cells 38-1 to 38-8 of FIG. 1.

Figure 6:
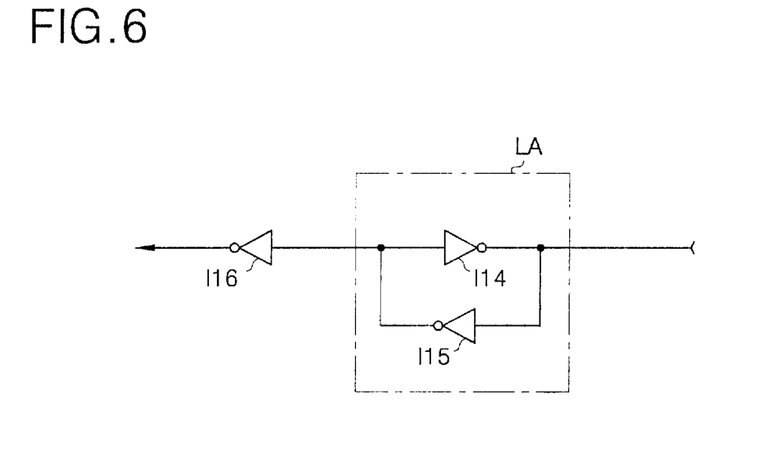
FIG. 6 is a circuit diagram illustrating a redundant cell.

FIG. 6 is a circuit diagram illustrating an embodiment of the redundant cells 38-1 to 38-8 of FIG. 1. Each of the redundant cells 38-1 to 38-8 comprises a latch LA having latch inverters I14 and I15 and an output inverter I16. The latch inverters I14 and I15 latch the data and the output inverter I16 inverts and outputs it.

Figure 7:
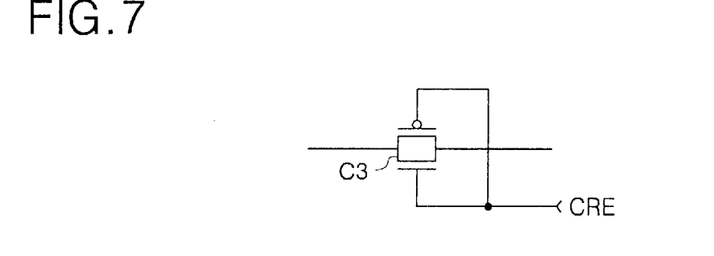
FIG. 7 is a circuit diagram illustrating a switch.

FIG. 7 is a circuit diagram illustrating an embodiment of the output switches 36-1 to 36-9 of FIG. 1. Each of the output switches 36-1 to 36-8 comprises a CMOS transmission gate C3. The CMOS transmission gate C3 transmits data stored in the redundant cell to the driver when the redundant cell read control signal CRE his "high".

Figure 8:
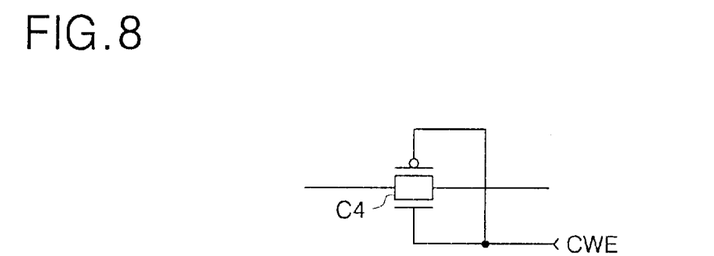
FIG. 8 is a circuit diagram illustrating a switch.

FIG. 8 is a circuit diagram illustrating an embodiment of the input switches 40-1 to 40-8 of FIG. 1. Each of the input switches 40-1 to 40-8 comprises a CMOS transmission gate C4. The CMOS transmission gate C4 transmits data outputted from the input buffer to the redundant cell when the redundant cell-write control signal CWE is "high".

Figure 9:
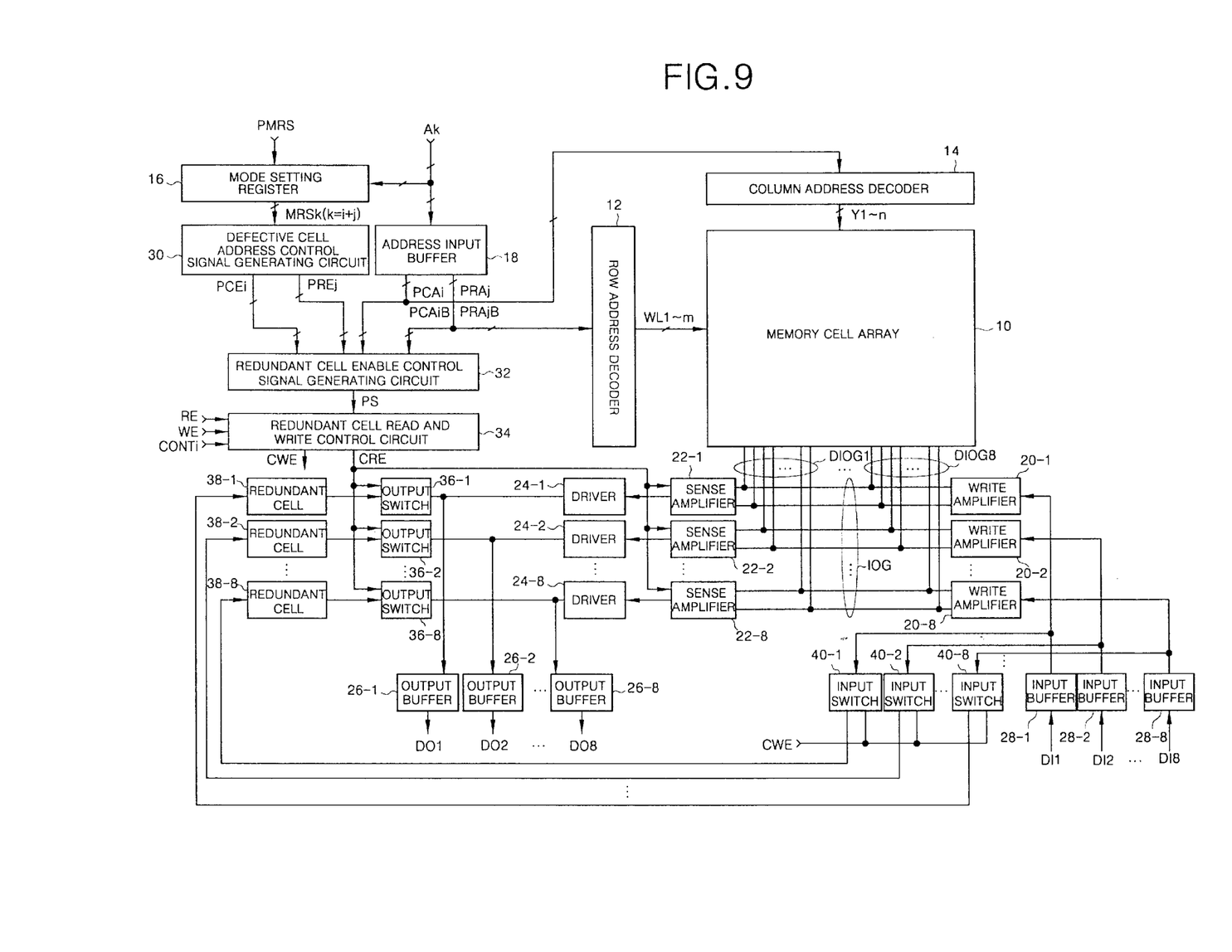
FIG. 9 is a block diagram illustrating another embodiment of the invention.

FIG. 9 is a block diagram illustrating another embodiment of the invention. Output switches 36-1 to 36-8 and 40-1 to 40-8, and redundant cells 38-1 to 38-8 of FIG. 9 are arranged between the drivers 24-1 to 24-8 and the output buffers 26-1 to 26-8 differently than shown FIG. 1, otherwise the rest of the schematic is identical. Note that here the redundant cells 38-1 to 38-8 of FIG. 9 are connected (through the output switches 36-1 to 36-8) between the drivers 24-1 to 24-8 and the output buffers 26-1 to 26-8, while the redundant cells of FIG. 1 are connected via the output switches between the sense amplifiers 22-1 to 22-8 and the output buffers. Like circuit components of FIGS. 1 and 9 perform like operations.

Figure 10:
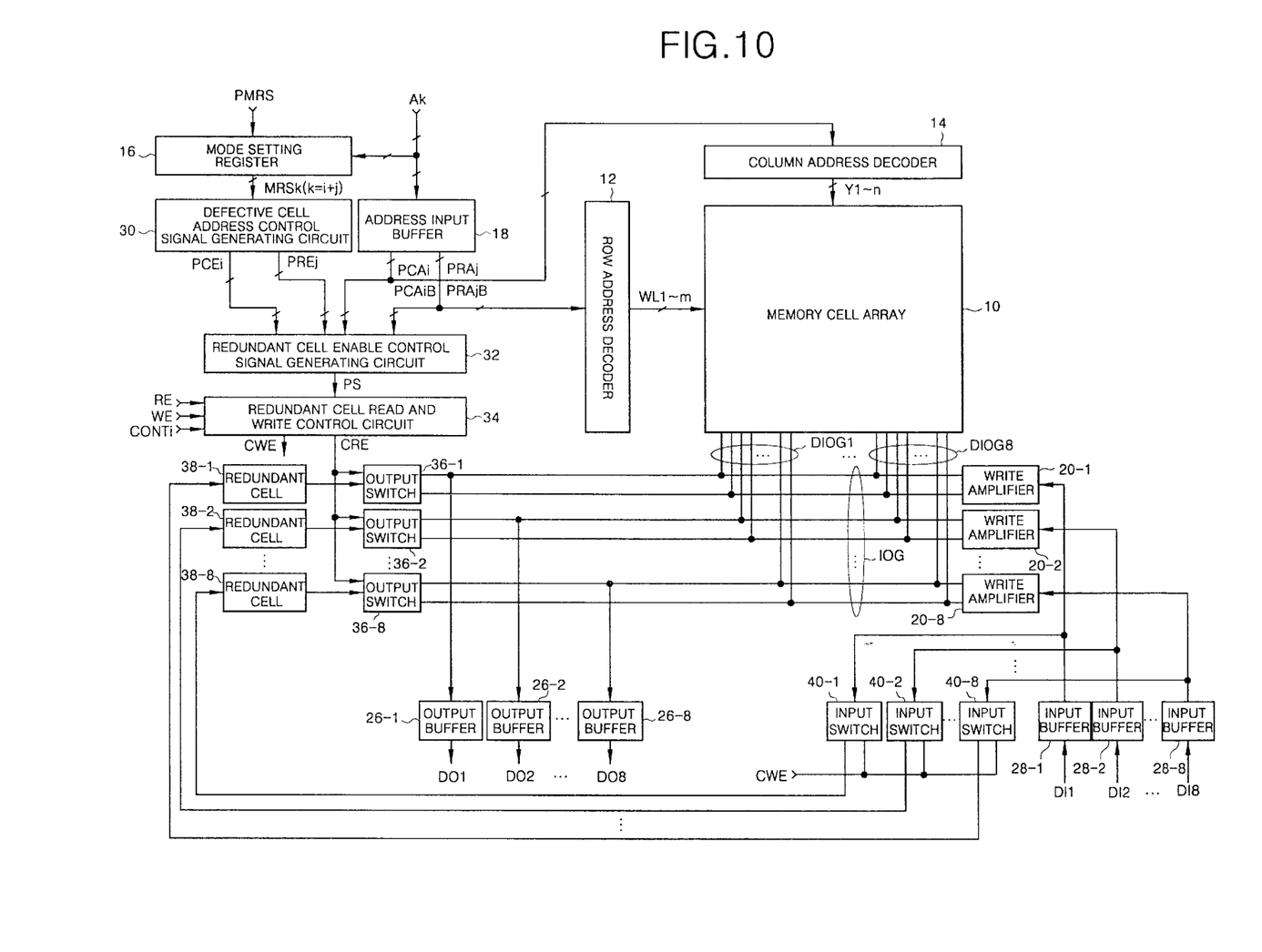
FIG. 10 is a block diagram illustrating another embodiment of the invention.

FIG. 10 illustrates yet another embodiment of the invention. Output switches 36-1 to 36-8 and 40-1 to 40-8 and redundant cells 38-1 to 38-8 of FIG. 9 are arranged between I/O line group IOG and the input buffers 28-1 to 28-8, and the sense amplifiers 22-1 to 22-8 and the drivers 24-1 to 24-8 are eliminated entirely. In the semiconductor memory device of FIG. 10, the memory cell array 10 comprises built-in voltage sense amplifiers (not shown) and therefore when data is transferred from the memory cell array 10 to the data I/O line groups DIOG1 to DIOG8, the built-in voltage sense amplifiers transfer amplified the data. Therefore, in the semiconductor memory device of FIG. 10, the sense amplifiers 22-1 to 22-8 and the drivers 24-1 to 24-8 of FIG. 1 are not required. An operation of the voltage sense amplifiers (not shown) in the memory cell array 10 is controlled in response to the redundant cell read control signal CRE, such that the built-in sense amplifiers are shut off when the output switches 36-1 to 36-8 are active.

The embodiment of FIG. 10 allows for a substantially reduced layout area size by arranging the redundant cells into the input and output line group IOG.

The preferred embodiments of the invention show the semiconductor memory device having a circuit configuration to repair 1-bit defective cells. However, it is possible to design a semiconductor memory device having a circuit configuration to repair n-bit defective cells by providing n redundant cells and switches in parallel and by adapting the circuit configuration to generate the redundant cell read and write control signal applied to the switches.

Also, though the defective cell address control signal generating circuit 30 has been depicted to program, latch, and output the defective cell address control signals PCEi and PCEj in response to the signals MRSk(k=i+j) outputted from the mode setting register 16, the circuit may nevertheless be modified so that the mode setting register 16 latches and then outputs the signals MRSk(k=i+j) directly into the redundant cell enable control signal generating circuit 32 without the defective cell address control signal generating circuit 30 and thereby simplify the system.

As described herein before, because the semiconductor memory device can replace the defective cells with the redundant cells at a packaging level, the manufacturing yield is improved. Also, the redundant cells are arranged in the I/O line group, and thus it is easy to layout the semiconductor memory device.

It is to be understood that all physical quantities disclosed herein, unless explicitly indicated otherwise, are not to be construed as exactly equal to the quantity disclosed, but rather about equal to the quantity disclosed. Further, the mere absence of a qualifier such as "about" or the like, is not to be construed as an explicit indication that any such disclosed physical quantity is an exact quantity, irrespective of whether such qualifiers are used with respect to any other physical quantities disclosed herein.

While preferred embodiments have been shown and described, various modifications and substitutions may be made thereto without departing from the spirit and scope of the invention. Accordingly, it is to be understood that the present invention has been described by way of illustration only, and such illustrations and embodiments as have been disclosed herein are not to be construed as limiting to the claims.

What is claimed is:

1. A semiconductor memory device, comprising:
   a memory cell array receiving and outputting data through data I/O line groups;
   at least one redundant cell control adapted to storing a defective cell address, generating a redundant cell enable control signal when the defective cell address is equal to an input cell address, generating a redundant cell read control signal during a read operation in response to the redundant cell enable control signal, and generating a redundant cell write control signal during a write operation in response to the redundant cell enable control signal;
   a sense amplifier connected to an I/O line group commonly connected to the data I/O line groups, adapted to amplify and output data outputted from the memory cell array during the read operation, and disabled in response to the redundant cell read control signal; and
   at least one redundant cell adapted to store input data transferred to the I/O line group in response to the redundant cell write control signal and outputting stored data in response to the redundant cell read control signal.

2. The device of claim 1, wherein the sense amplifier comprises:
   a current amplifier adapted to detect and amplify a current difference of respective I/O line pairs of the I/O line group; and
   a driver adapted to driving output signals of the current amplifier.

3. The device of claim 1, wherein the redundant cell comprises:
   an input switch adapted to transfer the input data in response to the redundant cell write control signal;
   a redundant cell adapted to store data applied from the input switch; and
   an output switch adapted to transfer data outputted from the redundant cell in response to the redundant cell read control signal.

4. The device of claim 3, wherein the redundant cell comprises:
   a first inverter inverting data transferred from the input switch;
   a second inverter inverting output signals of the first inverter and transferring the output signals to the first inverter; and
   a third inverter inverting the output signals of the first inverter and transferring the output signal of the first inverter to the output switch.

5. The device of clam 3, wherein the input switch comprises a first CMOS transmission gate for transferring signals stored in the redundant cell in response to the redundant cell read control signal.

6. The device of claim 3, wherein the output switch comprises a second CMOS transmission gate for storing data in the redundant cell in response to the redundant cell write control signal.

7. The device of claim 1, wherein the redundant cell control comprises:
   a mode setting register storing the defective cell address applied from an external portion in response to mode control signal;

a defective cell address control signal generator adapted to store the defective cell address and generating a defective cell address control signal;

a redundant cell enable control signal generator adapted to generate the redundant cell enable control signal in response to the defective cell address control signal when the input address is equal to the defective cell address; and a redundant cell read and write control adapted to generate the redundant cell read control signal during the read operation and generating the redundant cell write control signal during the write operation, in response to the redundant cell enable control signal.

8. The device of claim 7, wherein the defective cell address control signal generator comprises:

a first fuse having a terminal connected to a power source;

a second fuse having a terminal connected to the power source;

a first buffer buffering the defective cell address;

a first switching transistor comprising a drain connected to another terminal of the first fuse, a gate connected to an output signal of the buffer, and a source connected to a ground voltage;

a first PMOS transistor comprising a source connected to another terminal of the first fuse, a gate connected to a first node, and a drain connected to a second;

a second PMOS transistor comprising a source connected to the other side of the second fuse, a gate connected to the second node, a drain connected to the first node;

a first NMOS transistor comprising a gate adapted to receive a reset signal, a drain connected to the second node, a source connected to the ground voltage;

a second NMOS transistor comprising a drain connected to the drain of the first NMOS transistor, a gate connected to the first node, and a source connected to the ground voltage;

a third NMOS transistor comprising a drain connected to the first node, a gate connected to the second node, and a source connected to the ground voltage;

a fourth NMOS transistor comprising a gate applying a reset signal, a drain connected to the first node, and a source connected to the ground voltage; and second buffer buffering a signal of the first node, generating the defective cell address control signal, and provided for each of bits of the address.

9. The device of claim 7, wherein the redundant cell enable control signal generator comprises:

a third CMOS transmission gate adapted to transfer an inverted address of the input address as an output signal in response to the defective cell address control signal;

a signal generator provided for each of bits of the address and comprising a fourth CMOS transmission gate for transferring the input address as the output signal in response to an inverted signal of the defective cell address control signal;

an AND gate generating the redundant cell enable control signal by ANDing signals outputted from the signal generator.

10. The device of claim 7, wherein the redundant cell enable control signal generator comprises:

a first NAND gate outputting an inverted address of the input address in response to the defective cell address control signal;

a second NAND gate adapted to output the input address in response to the inverted signal of the defective cell address control signal;

wherein signal generators are provided for each bit of the address comprising a third NAND gate for generating an output signal by NANDing output signals of the first and second NAND gates; and an AND gate generating the redundant cell enable control signal by ANDing signals outputted from the signal generators.

11. The device of claim 7, wherein the redundant cell read and write control comprises:

a redundant cell read control signal generator adapted to generate signals by ANDing the redundant cell enable control signal and a control command during the read operation as the redundant cell read control signal;

a pulse generator adapted to receive a signal generated by ANDing the redundant cell enable control signal and a control command to generate a pulse signal having a predetermined pulse width; and a redundant cell write control signal generator adapted to generate an output signal of the pulse generator as the redundant cell write control signal during the write operation.

12. The device of claim 1, wherein the redundant cell control comprises:

a mode setting register storing the defective cell address applied from an external portion and outputting a defective cell address control signal, in response to mode control signal;

a redundant cell enable control signal generator adapted to generate the redundant cell enable control signal when the input address is equal to the defective cell address in response to the defective cell address control signal; and a redundant cell read and write control adapted to generate the redundant cell read control signal during the read operation and generating the redundant cell write control signal during the write operation in response to the redundant cell enable control signal.

13. The device of claim 12, wherein the redundant cell enable control signal generator comprises:

a third CMOS transmission gate transferring inverted address of the input address as an output signal in response to the defective cell address control signal;

a signal generator provided for each bit of the address comprising a fourth CMOS transmission gate for transferring the input address as the output signal in response to an inverted signal of the defective cell address control signal; and an AND gate generating the redundant cell enable control signal by ANDing signals outputted from the signal generators.

14. The device of claim 12, wherein the redundant cell enable control signal generator comprises:

a first NAND gate outputting an inverted address of the input address in response to the defective cell address control signal;

a second NAND gate outputting the input address in response to the inverted signal of the defective cell address control signal;

a signal generator provided for each bit of the address and comprising a third NAND gate for generating an output signal by NANDing output signals of the first and second NAND gates; and a AND gate generating the redundant cell enable control signal by ANDing signals outputted from the signal generator.

15. The device of claim 12, wherein the redundant cell read and write control comprises:
- a redundant cell read control signal generator adapted to generate signals generated by ANDing the redundant cell enable control signal and a control command during the read operation as the redundant cell read control signal;
- a pulse generator receiving a signal generated by ANDing the redundant cell enable control signal and a control command to generate a pulse signal having a predetermined pulse width; and
- a redundant cell write control signal generator adapted to generate an output signal of the pulse generator as the redundant cell write control sgianl during the write operation.

16. A semiconductor memory device, comprising:
- a memory cell array receiving and outputting data through data I/O line groups;
- at least one redundant cell control means for storing a defective cell address, generating a redundant cell enable control signal when the defective cell address is equal to an input cell address, generating a redundant cell read control signal during a read operation in response to the redundant cell enable control signal, and generating a redundant cell write control signal during a write operation in response to the redundant cell enable control signal;
- a sense amplifying means for amplifying data transferred through the data I/O line groups and transferring the data to an I/O line group. commonly connected to the data I/O line groups during the read operation, and disabled in response to the redundant cell read control signal; and
- at least one redundant cell means for storing input data transferred to the I/O line group in response to the redundant cell write control signal and outputting stored data in response to the redundant cell read control signal.

17. The device of claim 16, wherein the sense amplifying means detects and amplifies a voltage difference of data transferred through the data I/O line groups.

18. The device of claim 16, wherein the redundant cell means comprises:
- a first switching means for transferring the input data in response to the redundant cell write control signal;
- a redundant cell adapted to store data applied from the first switching means for; and
- a second switching means for transferring data outputted from the redundant cell in response to the redundant cell read control signal.

19. The device of claim 18, wherein the redundant cell comprises:
- a first inverter means for inverting data transferred from the first switching means;
- a second inverter means for inverting output signals of the first inverter means and transferring the output signals to the first inverter means; and
- a third inverter means for inverting the output signals of the first inverter means and transferring the output signal of the first inverter means to the second switching means.

20. The device of clam 18, wherein the first switching means comprises a first CMOS transmission gate for transferring signals stored in the redundant cell in response to the redundant cell read control signal.

21. The device of claim 18, wherein the second switching means comprises a second CMOS transmission gate for storing data in the redundant cell in response to the redundant cell write control signal.

22. The device of claim 16, wherein the redundant cell control means comprises:
- a mode setting register means for storing the defective cell address applied from an external portion in response to modeall control signal;
- a defective cell address generating means for storing the defective cell address and generating a defective cell address control signal;
- a redundant cell enable control signal generating means for generating the redundant cell enable control signal in response to the defective cell address control signal when the input address is equal to the defective cell address; and
- a redundant cell read and write control means for generating the redundant cell read control signal during the read operation and generating the redundant cell write control signal during the write operation, in response to the redundant cell enable control signal.

23. The device of claim 22, wherein the defective cell address control signal generating means comprises:
- a first fuse comprising a terminal connected to al power source;
- a second fuse comprising a terminal connected to the power source;
- a first buffer means for buffering the defective cell address;
- a first switching transistor comprising a drain connected to another terminal of the first fuse, a gate connected to an output signal of the buffer, and a source connected to a ground voltage;
- a first PMOS transistor comprising a source connected to another of the first fuse, a gate connected to a first node, and a drain connected to a second;
- a second PMOS transistor comprising a source connected to another terminal of the second fuse, a gate connected to the second node, a drain connected to the first node;
- a first NMOS transistor comprising a gate adapted to receive a reset signal, a drain connected to the second node, and a source connected to the ground voltage;
- a second NMOS transistor comprising a drain connected to the drain of the first NMOS transistor, a gate connected to the first node, and a source connected to the ground voltage;
- a third NMOS transistor comprising a drain connected to the first node, a gate connected to the second node, and a source connected to the ground voltage;
- a fourth NMOS transistor comprising a gate applying a reset signal, a drain connected to the first node, and a source connected to the ground voltage; and
- second buffer means for buffering a signal of the first node, generating the defective cell address control signal, and provided for each of bits of the address.

24. The device of claim 22, wherein the redundant cell enable control signal generating means comprises:
- a third CMOS transmission gate means for transferring an inverted address of the input address as an output signal in response to the defective cell address control signal;
- a signal generating means provided for each of bits of the address and comprising a fourth CMOS transmission gate for transferring the input address as the output signal in response to an inverted signal of the defective cell address control signal; and an AND gate means for generating the redundant cell enable control signal by ANDing signals outputted from the signal generating means.

25. The device of claim 22, wherein the redundant cell enable control signal generating means comprises:

a first NAND gate means for outputting an inverted address of the input address in response to the defective cell address control signal;

a second NAND gate means for outputting the input address in response to the inverted signal of the defective cell address control signal;

signal generating means provided for each bit of the address and comprising a third NAND gate means for generating an output signal by NANDing output signals of the first and second NAND gate means; and an AND gate generating the redundant cell enable control signal by ANDing signals outputted from the signal generating means.

26. The device of claim 22, wherein the redundant cell read and write control means comprises:

a redundant cell read control signal generating means for generating signals generated by ANDing the redundant cell enable control signal and a control command during the read operation as the redundant cell read control signal;

a pulse generating means for receiving a signal generated by ANDing the redundant cell enable control signal and a control command to generate a pulse signal having a predetermined pulse width; and a redundant cell write control signal generating means for generating an output signal of the pulse generating means as the redundant cell write control sgianl during the write operation.

27. The device of claim 16, wherein the redundant cell control means comprises:

a mode setting register means for storing an defective cell address applied from an external portion and outputting a defective cell address control signal, in response to mode control signal;

a redundant cell-enable control signal generating means for generating the redundant cell enable control signal when the input address is equal to the defective cell address in response to the defective cell address control sginal; and a redundant cell read and write control means for generating the redundant cell read control signal during the read operation and generating the redundant cell write control signal during the write operation in response to the redundant cell-enable control signal.

28. The device of claim 27, wherein the redundant cell-enable control signal generating means comprises:

a third CMOS transmission gate means for transferring an inverted address of the input address as an output signal in response to the defective cell address control signal;

a signal generating means provided for each bit of the address and comprising a fourth CMOS transmission gate means for transferring the input address as the output signal in response to an inverted signal of the defective cell address control signal;

an AND gate means for generating the redundant cell enable control signal by ANDing signals outputted from the signal generating means.

29. The device of claim 27, wherein the redundant cell enable control signal generating means comprises:

a first NAND gate means for outputting an inversed address of the input address in response to the defective cell address control signal;

a second NAND gate means for outputting the input address in response to the inversed signal of the defective cell address control signal;

signal generating means provided for each bit of the address and comprising a third NAND gate means for generating an output signal by NANDing output signals of the first and second NAND gate means; and an AND gate means for generating the redundant cell enable control signal by ANDing signals outputted from the signal generating means.

30. The device of claim 27, wherein the redundant cell read and write control means comprises:

a redundant cell read control signal generating means for generating signals generated by ANDing the redundant cell enable control signal and a control command during the read operation as the redundant cell read control signal;

a pulse generating means for receiving a signal generated by ANDing the redundant cell enable control signal and a control command to generate a pulse signal having a predetermined pulse width; and a redundant cell write control signal generating means for generating an output signal of the pulse generating means as the redundant cell write control sgianl during the write operation.

31. A method of repairing a semiconductor memory device comprising a memory cell array for receiving and outputting data through data I/O line groups and an I/O line group commonly connected to the data I/O line groups, the method comprising:

storing a defective cell address in response to all control signals;

generating a redundant cell enable control signal when an input address is equal to the defective cell address;

generating a redundant cell read control signal during a read operation and generating a redundant cell write control signal during a write operation in response to the redundant cell enable control signal; and outputting data stored in a redundant cell in response to the redundant cell read control signal during the read operation, and storing input data from the redundant cell in response to the redundant cell write control signal during the write operation.

32. The method of claim 31, wherein when the data stored in the redundant cell are transferred to the I/O line group, a transmission of data stored in the memory cell array to the I/O line group is cut off.

33. The method of claim 31, wherein when the input data are stored in the redundant cell, the input data are also transferred to the memory cell array.

* * * * *